(12) United States Patent
Gatta et al.

(10) Patent No.: US 7,425,863 B2
(45) Date of Patent: Sep. 16, 2008

(54) TUNEABLE FILTERS USING OPERATIONAL AMPLIFIERS

(75) Inventors: Francesco Gatta, Laguna Niguel, CA (US); Rajeshmohan Radhamohan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/604,194

(22) Filed: Nov. 27, 2006

(65) Prior Publication Data
US 2007/0132507 A1 Jun. 14, 2007

Related U.S. Application Data

(60) Provisional application No. 60/749,608, filed on Dec. 13, 2005.

(51) Int. Cl.
*H03K 5/00* (2006.01)
(52) U.S. Cl. .................. 327/558; 327/552; 327/553; 327/554
(58) Field of Classification Search .......... 327/551–559
See application file for complete search history.

(56) References Cited

U.S. PATENT DOCUMENTS

| 6,452,443 | B1* | 9/2002 | Thompson et al. | .......... 327/553 |
| 6,958,644 | B2* | 10/2005 | Palaskas et al. | ............. 327/553 |
| 7,180,939 | B2* | 2/2007 | Palaskas et al. | ............. 375/229 |
| 2001/0033196 | A1* | 10/2001 | Lennous et al. | ............. 327/552 |

OTHER PUBLICATIONS

*Application Note 727: Filter Design Using Integrator Blocks*, 5 pages, printed Aug. 21, 2006 from http://www.maxim-ic.com/appnotes.cfm/appnote_number/727, dated Jan. 16, 2001.

\* cited by examiner

*Primary Examiner*—Dinh T. Le
(74) *Attorney, Agent, or Firm*—Sterne, Kessler, Goldstein & Fox PLLC

(57) ABSTRACT

A low pass filter includes a switchable resistor bank, a gain stage, and a capacitor bank. The resistors and capacitors switched into the circuit determine a cutoff frequency of the low pass filter. Frequency programmability may be obtained using the switchable resistor bank implemented as a parallel bank of binary weighted resistors. Further frequency programmability may be obtained using the switchable capacitor bank in conjunction with the switchable resistor bank. The resistor and capacitor processes in a semiconductor wafer are sufficiently accurate and repeatable so as to minimize any necessary calibration.

17 Claims, 6 Drawing Sheets

TUNEABLE FILTERS USING OPERATIONAL AMPLIFIERS

CROSS-REFERENCE TO RELATED APPLICATIONS

This patent application claims priority to and is entitled to the benefit of U.S. Provisional Patent Application No. 60/749,608, filed Dec. 13, 2005, entitled "Tuneable Linear Operational Amplifier," which is incorporated herein by reference in its entirety.

BACKGROUND OF THE INVENTION

1. Field of the Invention

The present invention relates to active filtering, more specifically tuning of active filters using operational amplifiers as a gain stage.

2. Background Art

A hard disk drive is storage device that uses magnetically coated disks called platters for the storage of digital data. The terms "hard disk," "hard disk drive," and "hard drive" are all used interchangeably, because the disk and its corresponding drive mechanism are a single unit. Most hard disk drives contain at least two platters dependent upon the storage capacity of the hard disk drive. Hard disk drives with a larger storage capacity contain a greater number of platters.

Each platter has a smooth magnetic surface for the storage of digital data. Data is written to a platter by applying a magnetic field from a read-write head close to the magnetic surface of the platter. The magnetic medium on the surface of the platter changes its magnetization due to the magnetic field of the read-write head. The data may be read back by a magnetoresistive read sensor also located on the read-write head. The magnetoresistive read sensor changes resistance to detect the magnetic flux corresponding to bit transitions of the digital data stored on the platter.

The read channel encodes and decodes the data from the read-write head. The read channel detects bits as an analog signal from the read-write head and converts them into digital form. Read channels use advanced mixed-signal and digital-signal processing technologies, in addition to advanced data-encoding schemes and digital filtering to optimize data detection. A read channel contains a low pass filter for anti-aliasing purposes as well as band limiting noise and equalizing the read signal.

Conventional low pass filters use a $G_m/C$ approach whereby the frequency characteristics of the filters are determined by transconductance amplifiers and capacitors. Because transconductance amplifiers are not stable and fluctuate over temperature and voltage, continuous tuning is required. If not continuously tuned, the read channel will generate corrupted data. To provide this continuous tuning, a replica of the low pass filter or a portion of the low pass filter is typically fabricated onto the same semiconductor substrate as the low pass filter. As a result a large portion, up to one quarter, of the substrate allocated for the low pass filter is used for tuning the transconductance amplifiers. In addition, the circuitry for the continuous tuning of the low pass filter consumes additional power.

What is needed is a low pass filter that is stable over temperature and voltage so as not to require continuous tuning.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

Figure 1:
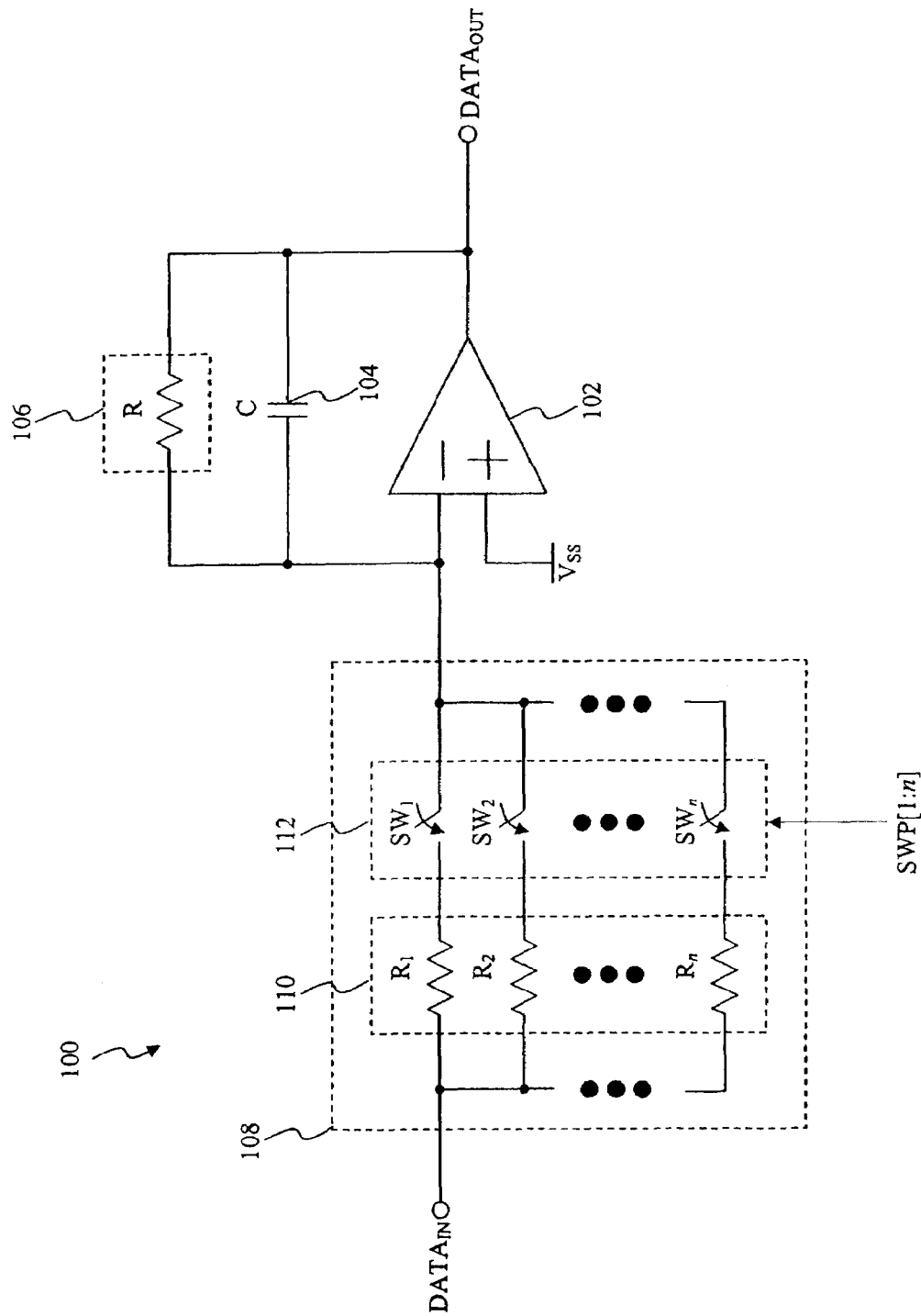
FIG. 1 illustrates a schematic diagram of a low pass filter according to an exemplary embodiment of the present invention.

FIG. 1 illustrates a schematic diagram of a low pass filter according to an exemplary embodiment of the present invention. Low pass filter 100 includes switchable resistor bank 108 coupled between an input, denoted as $DATA_{IN}$, and an inverting connection to operational amplifier 102. Although operational amplifier 102 is an operational amplifier, those skilled in the arts will understand that any suitable device may be used as a gain stage. As shown in FIG. 1, a "−" denotes the inverting connection of operational amplifier 102 and a "+" denotes a non-inverting connection of operational amplifier 102. The non-inverting connection of operational amplifier 102 further connects to potential $V_{SS}$. In an exemplary embodiment, potential $V_{SS}$ may be substantially equivalent to ground.

Switchable resistor bank 108 includes parallel resistor bank 110 connected to a corresponding switch in parallel switch bank 112. Parallel resistor bank 110 contains n resistors $R_1$ through $R_n$ configured in parallel with a common input connection. Each of the n resistors may be implemented using a single resistor, multiple resistors in series, multiple resistors in parallel, or any other suitable series or parallel combination of resistors. In an exemplary embodiment, parallel resistor bank 110 contains four binary weighted resistors $R_1$ through $R_4$ configured with the ratio $R_1:2*R_1:4*R_1:8*R_1$.

Each of the n resistors, $R_1$ through $R_n$, in parallel resistor bank 110 is further connected to a corresponding switch, $SW_1$ through $SW_n$, from parallel switch bank 112. Parallel switch bank 112 contains n switches $SW_1$ through $SW_n$ where each switch corresponds with an individual resistor in resistor bank 110. For example, $R_1$ is connected to $SW_1$, and $R_2$ is connected to $SW_2$. To minimize the parasitic effect of the resistance of the n switches $SW_1$ through $SWn$ on its corresponding resistor $R_1$ through $R_n$, the resistance of each switch when conducting is a small percentage of its corresponding resistor. In an exemplary embodiment, each switch, $SW_1$ through $SW_n$, may be implemented using a transistor fabricated with a either thick oxide process, for example 0.25 µm technology, or a thin oxide process, for example 65 nm technology. The thick oxide process minimizes the gds and/or drain junction capacitance. No dynamic power consumption is present since the switches are used in a static configuration.

The n switches $SW_1$ through $SW_n$ are controlled by an arrangement of n control lines, denoted as SWP[1:n] in FIG. 1. An individual switch allows its corresponding resistor to contribute to the overall resistance of switchable resistor bank 108. When a switch conducts, its corresponding resistor contributes to the overall resistance of switchable resistor bank 108, while those resistors whose switches are not conducting do not contribute. In the binary embodiment of switchable resistor bank 108 as presented above, if $SW_4$ is conducting and $SW_1$ through $SW_3$ are not conducting, the value of switchable resistor bank 108 is at its maximum resistance of $8*R_1$, the value of $R_4$. On the other hand, if $SW_1$ through $SW_4$ are conducting, the value of switchable resistor bank 108 is at its minimum resistance of $$\frac{8}{15}*R_1,$$

the parallel combination of $R_1$ through $R_4$.

Feedback capacitor 104 is connected between the inverting connection of operational amplifier 102 and an output, denoted as $DATA_{OUT}$, to form a negative feedback network. In other words, $DATA_{OUT}$ is fed back to the inverting connection of operational amplifier 102 via feedback capacitor 104. Feedback capacitor 104 may be implemented using a single capacitor, multiple capacitors in series, multiple capacitors in parallel, or any other suitable series or parallel combination of capacitors. Optional feedback resistor 106 may be placed parallel to feedback capacitor 104. Without optional feedback resistor 106, the impedance of the feedback network may become quite large at low frequencies. Placement of optional feedback resistor 106 in parallel with feedback capacitor 104 substantially limits the feedback impedance to prevent operational amplifier 102 from operating in an open loop configuration. Optional feedback resistor 106 may be implemented using a single resistor, multiple resistors in series, multiple resistors in parallel, or any other suitable series or parallel combination of resistors.

A low pass filter passes signals below a certain frequency, known as the cutoff frequency, while attenuating those signals above the cutoff frequency. The cutoff frequency, in Hertz, for low pass filter 100 may be found by evaluating:

$$f_{cutoff} = \frac{1}{2\pi\sqrt{RC}}, \quad (1)$$

where R is the equivalent resistance of switchable resistor bank 108 and C is the value of feedback capacitor 104. As mentioned above, switchable resistor bank 108 may be programmed to incorporate a range of resistances depending on the control line SWP. For the binary embodiment of the switchable resistor bank 108, when switchable resistor bank 108 is at its maximum resistance, the cutoff frequency in Hertz for low pass filter 100 is:

$$\frac{1}{2\pi\sqrt{R_4 C}} = \frac{1}{2\pi\sqrt{R_1 C}}. \quad (2)$$

On the other hand, when switchable resistor bank is at its minimum resistance, the cutoff frequency in Hertz for low pass filter 100 is:

$$\frac{1}{2\pi\sqrt{(R_1\|R_2\|R_3\|R_4)C}} = \frac{1}{2\pi\sqrt{\left(\frac{8}{15}R_1\right)C}}. \quad (3)$$

As evidenced by equations 2 and 3, minimizing the resistance of switchable resistor bank 108 maximizes the cutoff frequency of low pass filter 100, while maximizing the resistance of switchable resistor bank 108 minimizes the cutoff frequency of low pass filter 100.

Figure 2:
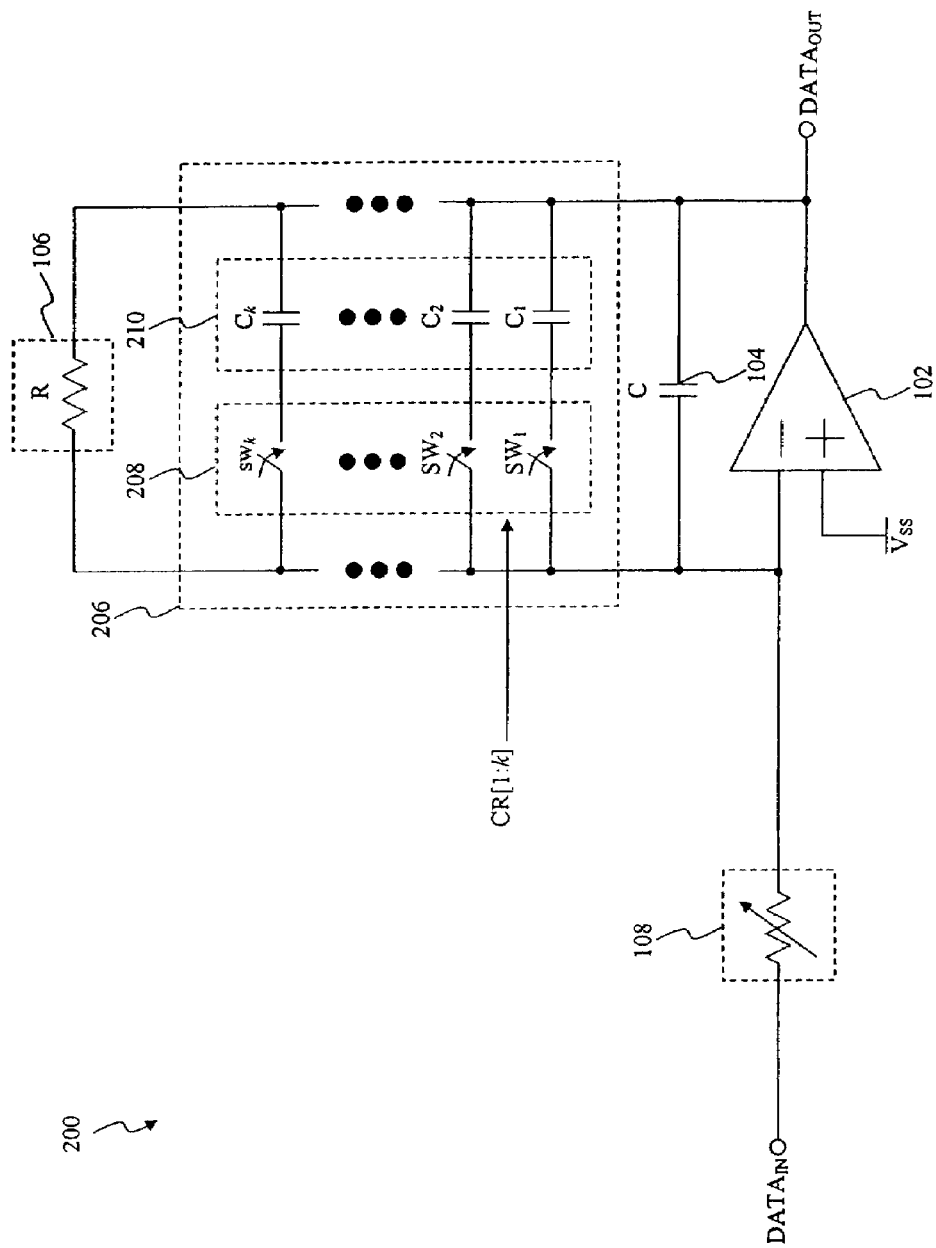
FIG. 2 illustrates a schematic diagram of a low pass filter according to another exemplary embodiment of the present invention.

FIG. 2 illustrates a schematic diagram of a low pass filter according to another exemplary embodiment of the present invention. Low pass filter 200 includes switchable resistor bank 108 coupled between an input, denoted as $DATA_{IN}$, and the inverting connection to operational amplifier 102. Switchable resistor bank 108 operates in a similar manner as described above in FIG. 1. Although operational amplifier 102 is an operational amplifier, those skilled in the arts will understand that any suitable device may be used as a gain stage. As shown in FIG. 2, a "−" denotes the inverting connection of operational amplifier 102 and a "+" denotes a non-inverting connection of operational amplifier 102. The non-inverting connection of operational amplifier 102 further connects to potential VSS. In an exemplary embodiment, potential VSS may be substantially equivalent to ground.

To obtain additional programmability as compared to low pass filter 100, low pass filter 200 includes switchable capacitor bank 206 in parallel with feedback capacitor 104 and optional feedback resistor 106. Switchable capacitor bank 206 includes parallel capacitor bank 210 connected to a corresponding switch from parallel switch bank 208. Parallel capacitor bank 210 contains k capacitors $C_1$ through $C_k$ arranged in parallel with a common input connection. Each of the k capacitors may be implemented using a single capacitor, multiple capacitors in series, multiple capacitors in parallel, or any other suitable series or parallel combination of capacitors. In an exemplary embodiment, parallel capacitor bank 110 contains four binary weighted capacitors $C_1$ through $C_4$ configured with the ratio $C_1:2*C_1:4*C_1:8*C_1$.

Each of the k capacitors $C_1$ through $C_k$ is further connected to a corresponding switch $SW_1$ through $SW_k$ from parallel switch bank 208. Parallel switch bank 208 contains k switches $SW_1$ through $SW_k$ where each switch corresponds with an individual capacitor in parallel capacitor bank 210. For example, $C_1$ is connected to $SW_1$ and $C_2$ is connected to $SW_2$. In another exemplary embodiment, each switch $SW_1$ through $SW_k$ is implemented using a transistor fabricated with a either thick oxide process, for example 0.25 μm technology, or a thin oxide process, for example 65 nm technology. The thick oxide process minimizes the gds and/or drain junction capacitance. No dynamic power consumption is present since the switches are used in a static configuration.

The k switches $SW_1$ through $SW_k$ are controlled by an arrangement of k control lines, denoted as CR[1:k] in FIG. 2. An individual switch allows its corresponding capacitor to contribute to the overall capacitance of switchable capacitor bank 206. When a switch conducts, its corresponding capacitor contributes to the overall capacitance, while those capacitors whose switches are not conducting do not contribute. In the binary embodiment of the switchable capacitor bank 206 as presented above, if $SW_1$ through $SW_4$ are not conducting, the value of switchable capacitor bank 206 is at its minimum capacitance of $C_1$. On the other hand, if $SW_1$ through $SW_4$ are conducting, the value of switchable capacitor bank 206 is at its maximum capacitance of 15*C1, the parallel combination of $C_1$ through $C_4$.

Feedback capacitor 104 is connected in parallel to switchable capacitor bank 206 between the inverting connection of operational amplifier 102 and an output, denoted as $DATA_{OUT}$, to form a negative feedback network. In other words, $DATA_{OUT}$ is fed back to the inverting connection of operational amplifier 102 via feedback capacitor 104 and switchable capacitor bank 206. Optional feedback resistor 106 may be placed parallel to feedback capacitor 104. Without optional feedback resistor 106, the impedance of the feedback network may become quite large at low frequencies. Placement of optional feedback resistor 106 in parallel with feedback capacitor 104 substantially limits the feedback impedance to prevent operational amplifier 102 from operating in an open loop configuration.

Using equation 1, the cutoff frequency, in Hertz, for low pass filter 200 is found by substituting the value of switchable resistor bank 108 for R and the parallel combination of switchable capacitor bank 206 and feedback capacitor 104 for C. As mentioned above, switchable capacitor bank 206 may be programmed to incorporate a range of resistances depending on the control input CR[1:k]. For the binary embodiment of the switchable capacitor bank 206, when switchable capacitor bank 206 is at its maximum capacitance, the cutoff frequency in Hertz for low pass filter 200 is:

$$\frac{1}{2\pi\sqrt{R(C\|C_1\|C_2\|C_3\|C_4)}} = \frac{1}{2\pi\sqrt{R*(C+15*C_1)}}. \quad (4)$$

On the other hand, when switchable capacitor bank 206 is at its minimum capacitance, the cutoff frequency in Hertz for low pass filter 200 is $$\frac{1}{2\pi\sqrt{R(C+C_1)}}. \quad (5)$$

As evidenced by equations 4 and 5, minimizing the capacitance of switchable capacitor bank 206 maximizes the cutoff frequency of low pass filter 100, while maximizing the capacitance of switchable capacitor bank 206 minimizes the cutoff frequency of low pass filter 100.

Figure 3:
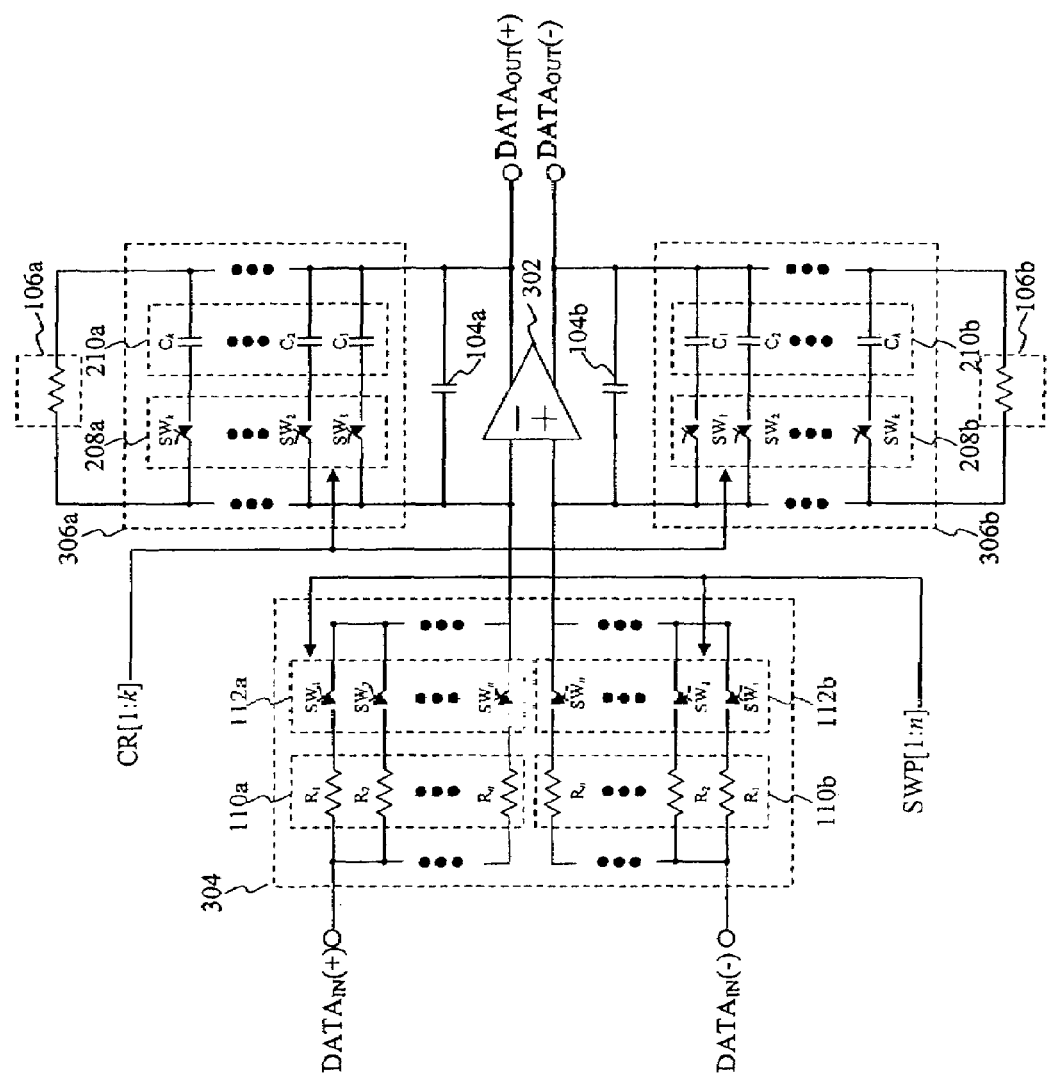
FIG. 3 illustrates a schematic diagram of a differential low pass filter according to an exemplary embodiment of the present invention.

FIG. 3 illustrates a schematic diagram of a differential low pass filter according to an exemplary embodiment of the present invention. Differential low pass filter 300 includes differential switchable resistor bank 304 coupled between an input, denoted as $DATA_{IN}$, and differential operational amplifier 302. Although differential operational amplifier 302 is a differential operational amplifier, those skilled in the arts will understand that any suitable device may be used as a gain stage. $DATA_{IN}$ is a differential signal comprising of the pair $DATA_{IN}(+)$ and $DATA_{IN}(-)$. Differential operational amplifier 302 includes an inverting connection, denoted by a "−", a non-inverting connection, denoted by a "+", and two output connections. The inverting connection of differential operational amplifier 302 is connected to $DATA_{IN}(+)$ via differential switchable resistor bank 304 while the non-inverting connection of differential operational amplifier 302 is connected to $DATA_{IN}(-)$ via differential switchable resistor bank 304.

Differential switchable resistor bank 304 includes a parallel resistor bank 110 and a parallel switch bank 112 for each signal in the differential pair $DATA_{IN}$. A first parallel resistor bank 110a couples $DATA_{IN}(+)$ to a first parallel switch bank 112a. The first parallel switch bank 112a further connects to the inverting terminal of differential operational amplifier 302. A second parallel resistor bank 110b couples $DATA_{IN}(-)$ to a second parallel switch bank 112b. The second parallel switch bank 112b further connects to the non-inverting terminal of differential operational amplifier 302.

Each of the n resistors in the parallel resistor bank 110a and the second parallel resistor bank 110b may be implemented using a single resistor, multiple resistors in series, multiple resistors in parallel, or any other suitable series or parallel combination of resistors. In an exemplary embodiment, each of the n resistors in the first parallel resistor bank 110a is substantially equal to resistors of the second parallel resistor bank 110b. For example, $R_1$ of the first parallel resistor bank 110a is substantially equal to $R_1$ of the second parallel resistor bank 110b. In another exemplary embodiment, first parallel resistor bank 110a and second parallel resistor bank 110b each contain four binary weighted resistors $R_1$ through $R_4$ configured with the ratio $R_1:2*R_1:4*R_1:8*R_1$.

The n switches $SW_1$ through $SW_n$ in both the first parallel switch bank 112a and the second parallel switch bank 112b are controlled by an arrangement of n control lines, denoted as SWP[1:n] in FIG. 3. In an exemplary embodiment, a single control line in the arrangement of n control lines controls each of the n switches $SW_1$ through $SW_n$ in the first parallel switch bank 112a simultaneously with each of the n switches $SW_1$ through $SW_n$ in the second parallel switch bank 112b. In other words, an individual switch in the first parallel switch bank 112a and a corresponding switch in the second parallel switch bank 112b are simultaneously controlled by a single control line. For example, switch $SW_1$ of the first parallel switch bank 112a and switch $SW_1$ of the second parallel switch bank 112b may be simultaneously controlled by control line SWP[1].

Differential low pass filter 300 includes a differential switchable capacitor bank 306 in parallel with feedback capacitor 104. Differential switchable capacitor bank 306a is parallel with the first feedback capacitor 104a and the first optional feedback resistor 106a, while differential switchable capacitor bank 306b is parallel with the second feedback capacitor 104b and the second optional feedback resistor 106b. Switchable capacitor bank 306a includes a first parallel capacitor bank 210a connected to a corresponding switch from a first parallel switch bank 208a, while switchable capacitor bank 306b includes a second parallel capacitor bank 210b connected to a corresponding switch from a second parallel switch bank 208b. Parallel capacitor bank 210 contains k capacitors $C_1$ through $C_k$ arranged in parallel with a common input connection. Each of the k capacitors may be implemented using a single capacitor, multiple capacitors in series, multiple capacitors in parallel, or any other suitable series or parallel combination of capacitors. Each of the k capacitors is further connected to a corresponding switch from parallel switch bank 208. In an exemplary embodiment, parallel capacitor bank 210 contains four binary weighted capacitors $C_1$ through $C_4$ configured with the ratio $C_1:2*C_1:4*C_1:8*C_1$.

The k switches $SW_1$ through $SW_k$ in the first parallel switch bank 208a and the second parallel switch bank 208b are controlled by an arrangement of k control lines, denoted as CR[1:k] in FIG. 3. In an exemplary embodiment, a single control line in the arrangement of k control lines controls each of the k switches $SW_1$ through $SW_k$ in the first parallel switch bank 208a simultaneously with each of the k switches $SW_1$ through $SW_k$ in the second parallel switch bank 208b. In other words, an individual switch in the first parallel switch bank 208a and a corresponding switch in the second parallel switch bank 208b are simultaneously controlled by a single control line. For example, switch $SW_1$ of the first parallel switch bank 208a and switch $SW_1$ of the second parallel switch bank 208b may be simultaneously controlled by control line CR[1].

A first feedback capacitor 104a is connected parallel to switchable capacitor bank 306a between the inverting connection of differential operational amplifier 302 and an output, denoted as $DATA_{OUT}(+)$, to form a negative feedback network. In other words, $DATA_{OUT}(+)$ is fed back to the inverting connection of differential operational amplifier 302 via the first feedback capacitor 104a. A second feedback capacitor 104b is connected parallel to switchable capacitor bank 306b between the non-inverting connection of differential operational amplifier 302 and an output, denoted as DATAOUT(−), to form a negative feedback network. In other words, $DATA_{OUT}(-)$ is fed back to the non-inverting connection of differential operational amplifier 302 via the second feedback capacitor 104b. The first feedback capacitor 104a and the second feedback capacitor 104b may be implemented using a single capacitor, multiple capacitors in series, multiple capacitors in parallel, or any other suitable series or parallel combination of capacitors. A first optional feedback resistor 106a may be placed parallel to the first feedback capacitor 104a. A second optional feedback resistor 106b may be placed parallel to the second feedback capacitor 104b. The first optional feedback resistor 106a and the second optional feedback resistor 106b may be implemented using a single resistor, multiple resistors in series, multiple resistors in parallel, or any other suitable series or parallel combination of resistors.

Using equation 1, the cutoff frequency, in Hertz, for differential low pass filter 300 is found by substituting the value of switchable resistor bank 304 for R and the parallel combination of switchable capacitor bank 306 and feedback capacitor 104 for C. As mentioned above, switchable capacitor bank 306 may be programmed to incorporate a range of resistances depending on the control input CR[1:k]. For the binary embodiment of the switchable resistor bank 304 and switchable capacitor bank 306, when switchable capacitor bank 306 is at its maximum capacitance and switchable resistor bank 304 is at its maximum resistance, the cutoff frequency in Hertz for low pass filter 300 is $$\frac{1}{2\pi\sqrt{R_4(C\|C_1\|C_2\|C_3\|C_4)}} = \frac{1}{2\pi\sqrt{R_4(C+15*C_1)}}. \quad (7)$$

On the other hand, when switchable capacitor bank 306 is at its minimum capacitance and switchable resistor bank 304 is at its minimum resistance, the cutoff frequency in Hertz for low pass filter 300 is $$\frac{1}{2\pi\sqrt{(R_1\|R_2\|R_3\|R_4)(C+C_1)}} = \frac{1}{2\pi\sqrt{\left(\frac{8}{15}*R_1\right)(C+C_1)}}. \quad (8)$$

As evidenced by equations 7 and 8, minimizing both the capacitance of switchable capacitor bank 306 and the resistance of switchable resistor bank 304, maximizes the cutoff frequency of differential low pass filter 300. While maximizing both the capacitance of switchable capacitor bank 306 and the resistance of switchable resistor bank 304, minimizes the cutoff frequency of differential low pass filter 300.

Low pass filter 100, low pass filter 200, and differential low pass filter 300 are first ordered filters that reduce the amplitude of signals above the cutoff frequency by half every time the frequency doubles for an attenuation of 6 dB/octave. To increase the amount of attenuation for signals above the cutoff frequency requires an increase in the order of the low pass filter. For example, a fourth ordered filter reduces the amplitude of signals above the cutoff frequency by sixteen every time the frequency doubles for an attenuation of 24 dB/octave.

Figure 4:
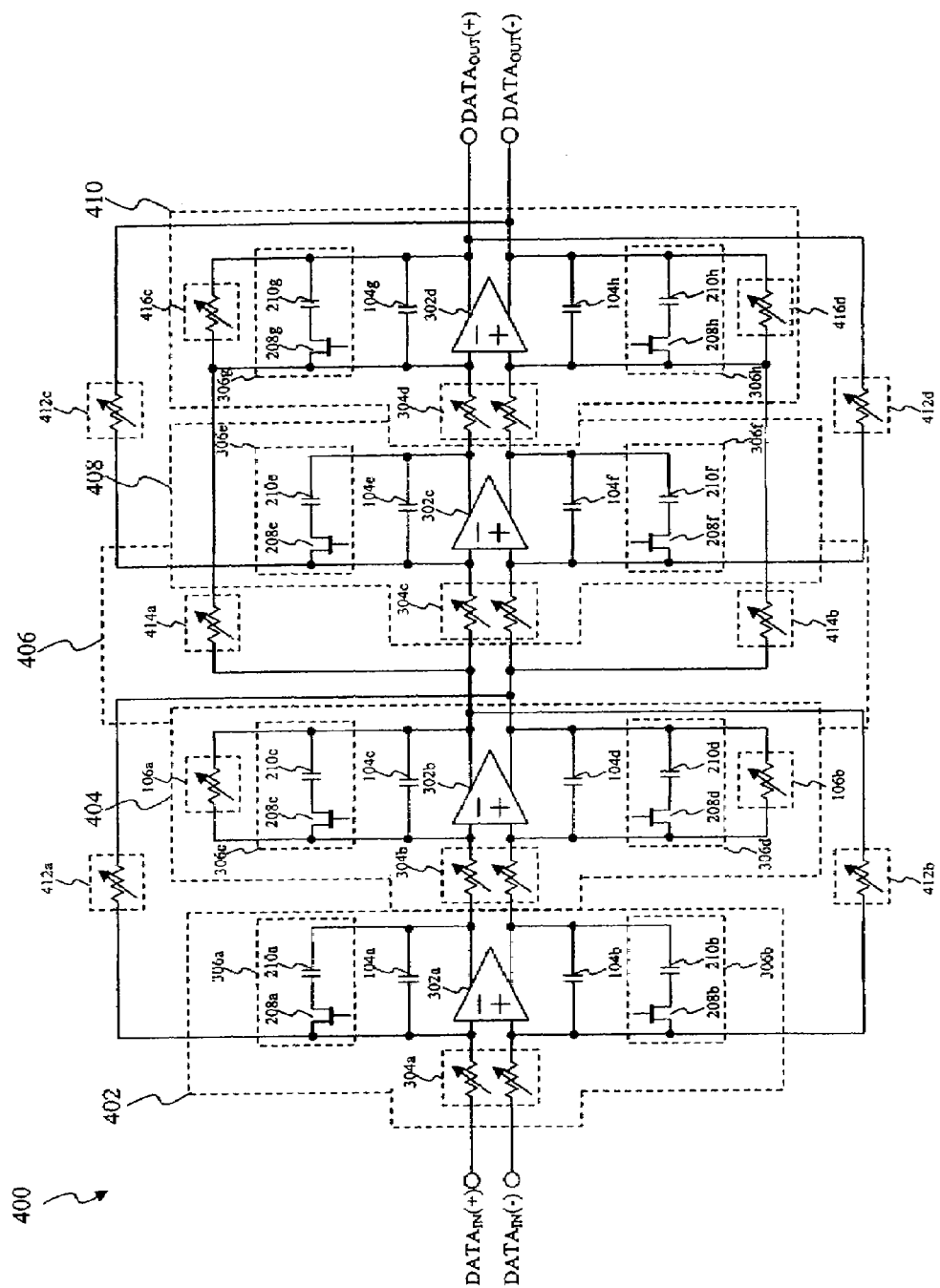
FIG. 4 illustrates a schematic diagram of a fourth order low pass filter according to an exemplary embodiment of the present invention.

FIG. 4 illustrates a schematic diagram of a fourth order low pass filter according to another exemplary embodiment of the present invention. First stage 402 of fourth order low pass filter 400 includes an input, denoted as $DATA_{IN}$, and an output coupled to an input of a second stage 404. $DATA_{IN}$ is a differential signal comprising of the pair $DATA_{IN}(+)$ and $DATA_{IN}(-)$. As shown in FIG. 4, first stage 402 may be constructed in a similar manner as differential low pass filter 300 without optional feedback resistor 106.

Switchable resistor bank 304a couples $DATA_{IN}$ to a differential operational amplifier 302a. As previously shown in FIG. 3, switchable resistor bank 304 includes a parallel resistor bank 110 and a parallel switch bank 112. Differential switchable capacitor bank 306a is arranged in parallel to a first feedback capacitor 104a, while differential switchable capacitor bank 306b is arranged in parallel to the second feedback capacitor 104b. Switchable capacitor bank 306a includes a first parallel capacitor bank 210a connected to a corresponding switch from a first parallel switch bank 208a, while switchable capacitor bank 306b includes a second parallel capacitor bank 210b connected to a corresponding switch from a second parallel switch bank 208b. In an exemplary embodiment, parallel switch bank 208 may be implemented with transistors. Those skilled in the arts will recognize that parallel switch bank 208 may be implemented with more than one switch and parallel capacitor bank 210 may be implemented using more than one capacitor as demonstrated by FIG. 3.

The second stage 404 of fourth order low pass filter 400 has an input coupled to switchable resistor bank 304b and an output coupled to the input of boost stage 406 and to the input of a third stage 408. As shown in FIG. 4, second stage 404 is constructed in a similar manner as differential low pass filter 300 including optional feedback resistor 106. Differential switchable capacitor bank 306c is parallel with the first feedback capacitor 104c and the first optional feedback resistor 106a, while differential switchable capacitor bank 306c is parallel with the second feedback capacitor 104c and the second optional feedback resistor 106b. In another exemplary embodiment, optional feedback resistor 416 may be implemented as switchable resistor bank 108, as shown in FIG. 1. Switchable capacitor bank 306c includes a first parallel capacitor bank 210c connected to a corresponding switch from a first parallel switch bank 208c, while switchable capacitor bank 306d includes a second parallel capacitor bank 210d connected to a corresponding switch from a second parallel switch bank 208d.

The second stage 404 of fourth order low pass filter 400 also includes an inversion resistor 412 to provide signal inversion. Inversion resistor 412 provides signal inversion by creating a negative feedback loop between the first stage 402 and the second stage 404. The negative output of the differential operational amplifier 302b located in second stage 404, is connected to the inverting connection of differential operational amplifier 302a located in the first stage 402, via a first inversion resistor 412a. Likewise, the positive output of the differential operational amplifier 302 located in second stage 404, is connected to the non-inverting connection of differential operational amplifier 302 located in the first stage 402, via a second inversion resistor 412b. In an exemplary embodiment, inversion resistor 412 may be implemented as switchable resistor bank 108 as shown in FIG. 1.

A boost stage 406 of fourth order low pass filter 400 has an input coupled to the output of the second stage 404 and an output coupled to an optional feedback resistor of a fourth stage 408. Boost stage 406 contains a first bypass resistor 414a coupled between the positive output of the differential operational amplifier 302b located in second stage 404, and the inverting input connection of differential operational amplifier 302d located in fourth stage 404. Boost stage 406 also contains a second bypass resistor 414b coupled between the negative output of the differential operational amplifier 302b located in second stage 404, and the non-inverting input connection of differential operational amplifier 302d located in fourth stage 404. In an exemplary embodiment, bypass resistor 414 may be implemented as switchable resistor bank 108, as shown in FIG. 1. Boost stage 406 provides signal equalization by creating a voltage dividing network including switchable resistor bank 304 located in the third stage 408 and bypass resistor 414. In other words, boost stage 406 may allow a portion of or the complete output of second stage 404 to bypass third stage 408.

The third stage 408 of fourth order low pass filter 400 has an input coupled to switchable resistor bank 304c and to boost stage 408, and an output coupled to the input of fourth stage 410. As shown in FIG. 4, third stage 408 may be constructed in a similar manner as differential low pass filter 300 without optional feedback resistor 106. More specifically, switchable resistor bank 304 couples the output of second stage 404 and boost stage 408 to differential operational amplifier 302c. As previously shown in FIG. 3, switchable resistor bank 304c includes parallel resistor bank 110 and parallel switch bank 112. Differential switchable capacitor bank 306e is parallel with the first feedback capacitor 104e, while differential switchable capacitor bank 306f is parallel with the second feedback capacitor 104f. Switchable capacitor bank 306e includes a first parallel capacitor bank 210e connected to a corresponding switch from a first parallel switch bank 208e, while switchable capacitor bank 306f includes a second parallel capacitor bank 210f connected to a corresponding switch from a second parallel switch bank 208f.

Fourth stage 410 of fourth order low pass filter 400 has an input coupled to switchable resistor bank 304d and an output coupled to DATAOUT. DATAOUT is a differential signal comprising of the pair DATAOUT(+) and DATAOUT(−). As shown in FIG. 4, fourth stage 410 may be constructed in a similar manner as differential low pass filter 300 including optional feedback resistor 106. Differential switchable capacitor bank 306g is parallel with the first feedback capacitor 104g and the first optional feedback resistor 106c, while differential switchable capacitor bank 306h is parallel with the second feedback capacitor 104h and the second optional feedback resistor 106d. In another exemplary embodiment, optional feedback resistor 416 may be implemented as switchable resistor bank 108, as shown in FIG. 1. Switchable capacitor bank 306g includes a first parallel capacitor bank 210g connected to a corresponding switch from a first parallel switch bank 208g, while switchable capacitor bank 306h includes a second parallel capacitor bank 210h connected to a corresponding switch from a second parallel switch bank 208.

Fourth stage 410 of fourth order low pass filter 400 also includes an inversion resistor 412c to provide signal inversion. Inversion resistor 412 provides signal inversion by creating a negative feedback loop between the third stage 408 and the fourth stage 410. The negative output of the differential operational amplifier 302d located in fourth stage 410, is connected to the inverting connection of differential operational amplifier 302c located in the third stage 408, via a first inversion resistor 412c. The positive output of the differential operational amplifier 302 located in third stage 408, is connected to the non-inverting connection of differential operational amplifier 302 located in the third stage 408, via a second inversion resistor 412c. In a further exemplary embodiment, inversion resistor 412 may be implemented as switchable resistor bank 108 as shown in FIG. 1.

Each switchable resistor bank 304, each switchable capacitor bank 306, each inversion resistor 412, and each bypass resistor 414 may be implemented using a differing number of elements. For example, switchable resistor bank 304a through switchable resistor bank 304d, inversion resistor 412a through inversion resistor 412d, and bypass resistor 414a and bypass resistor 414b may comprise a differing number of resistors in a corresponding parallel resistor bank 110 and a differing number of switches in a corresponding parallel switch bank 112. Likewise, switchable capacitor bank 306a through switchable capacitor bank 306h may comprise a differing number of capacitors in a corresponding parallel switch bank 208 and a differing number of switches in a corresponding parallel switch bank 208.

Low pass filters of higher order may be implemented using a similar stage configuration as fourth order low pass filter 400. For example, a sixth order low pass filter may be implemented by connected the fourth stage 410 to an additional first stage 402 and second stage 404 as outlined above. An additional boost stage 406 may be placed between the fourth stage 410 and the newly added first stage 402.

Figure 5:
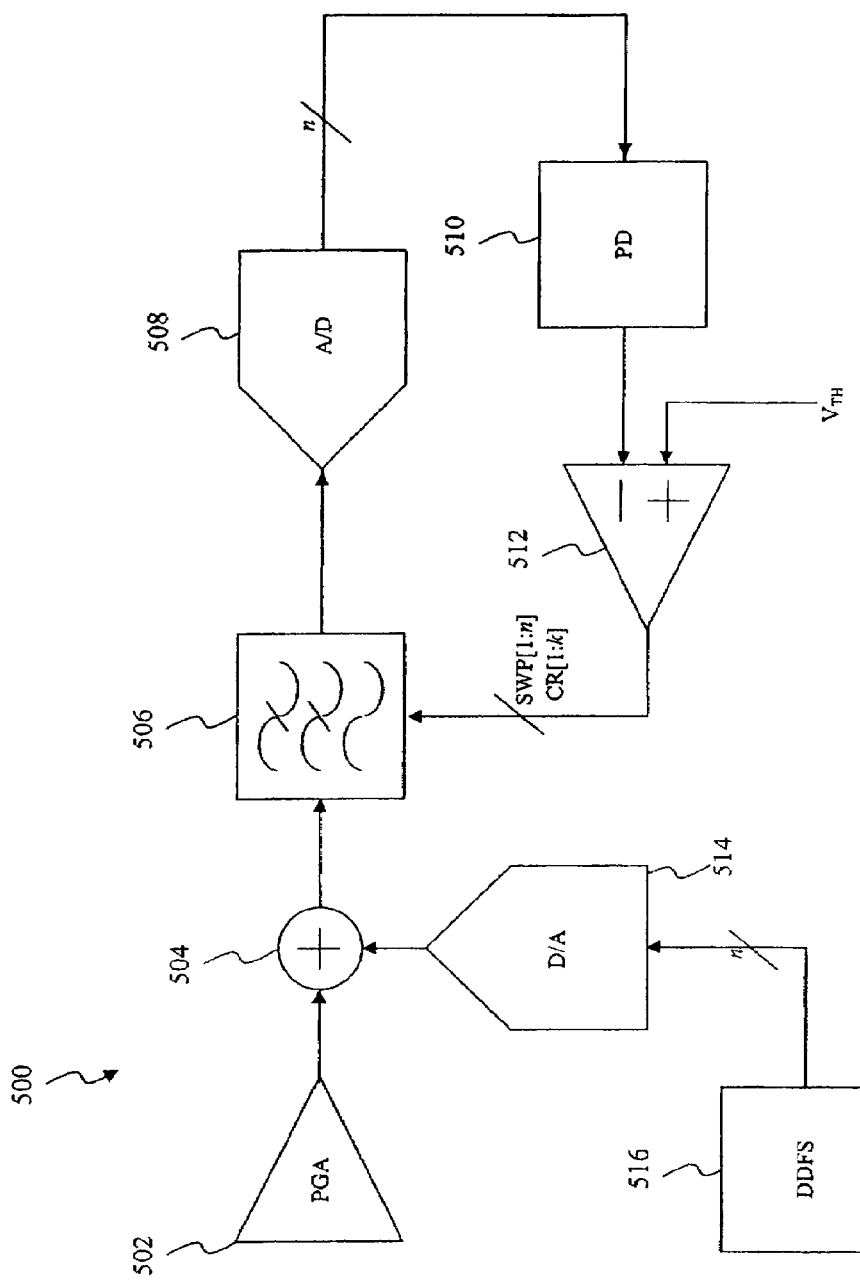
FIG. 5 illustrates a startup tuning configuration of a low pass filter according to an exemplary embodiment of the present invention.

FIG. 5 illustrates a startup tuning configuration of a low pass filter according to an exemplary embodiment of the present invention. As demonstrated above, the characteristics of the low pass filter according to each exemplary embodiment are determined using resistors and capacitors. The use of resistors and capacitors provide stability over voltage and temperature thereby eliminating the need for continuous time tuning. Once calibrated at startup, stability of the low pass filter over voltage and temperature is guaranteed from the stability of the resistors and capacitors.

Startup configuration 500 includes a switching node 504 to switch between the output of PGA 502 and the output of digital to analog converter 514. PGA 502 generates an analog tone from a signal from a hard disk drive. For start up tuning, the analog signal from the hard disk drive is not utilized.

During start up tuning, direct digital frequency synthesizer 516 simultaneously generates two digital tones with a frequency that is offset from the signal from the hard disk drive to form a tuning signal. The frequency of the first tone is less than the cutoff frequency of low pass filter 506. The first tone may be called a passband tone. The frequency of the second tone corresponds with the cutoff frequency of low pass filter 506, and is at least an octave away from the first tone. The second tone may be called a cut-off tone. For example, to tune a low pass filter to a cutoff frequency of 50 MHz, direct digital frequency synthesizer 516 generates a first tone with a frequency of 25 MHz and a second tone with a frequency of 50 MHz. Low pass filter 506 may be implemented using any one of the low pass filters demonstrated in FIG. 2 through FIG. 4.

After switching node 504, the tuning signal passes through low pass filter 506. Low pass filter 506 attenuates each tone within the tuning signal. The cutoff frequency of low pass filter 506 determines the amount of attenuation of each tone of the tuning signal. Low pass filter 506 contains switchable components that determine the cutoff frequency. For example, the cutoff frequency of low pass filter 200, as shown in FIG. 2, is determined by a switchable resistor bank 108 and a switchable capacitor bank 206. These switchable components are controlled either by control line SWP, when low pass filter 506 contains switchable resistor banks, or by control line SWP and CR when low pass filter 506 contains switchable resistor banks and switchable capacitor banks. Control line SWP contains n control lines, one control line to control each resistor in the switchable resistor banks. In an exemplary embodiment, each switchable resistor bank may be simultaneously controlled using one control line SWP with n control lines. In another embodiment, each switchable resistor bank may be independently controlled requiring a control line SWP for each switchable resistor bank within low pass filter 506. Control line CR contains k control lines, one control line to control each capacitor in the switchable capacitor banks. In an exemplary embodiment, each switchable capacitor bank is controlled using one control line CR with k control lines. In an additional embodiment, each switchable capacitor bank may be independently controlled, requiring a control line CR for each switchable capacitor bank within low pass filter 506.

After attenuation by low pass filter 506, analog to digital converter 508 digitizes the tuning signal. Once digitized, power detector 510 determines the relative power levels of the tuning signal. Comparator 512 next compares the power level with a threshold level, $V_{TH}$. An exemplary algorithm starts with the filter in the maximum bandwidth configuration. A 3 dB cut-off frequency may be defined as the frequency for which the ratio between the cut-off tone and the passband tone is approximately 0.7. If the relative measurement between the tones in the tuning signal is approximately 0.7, low pass filter 506 is considered tuned. The current values of the control lines SWP and CR, when applicable, form the control code that determines the cutoff frequency of low pass filter 506. After which, other filter tuning may be based on this reference. On the other hand, if the relative measurement between the tones in the tuning signal is higher or lower than 0.7, low pass filter 506 is not tuned. Adjustment is made to control lines SWP and CR, when applicable, until relative measurement between the two tones in the tuning signal is approximately 0.7.

Figure 6:
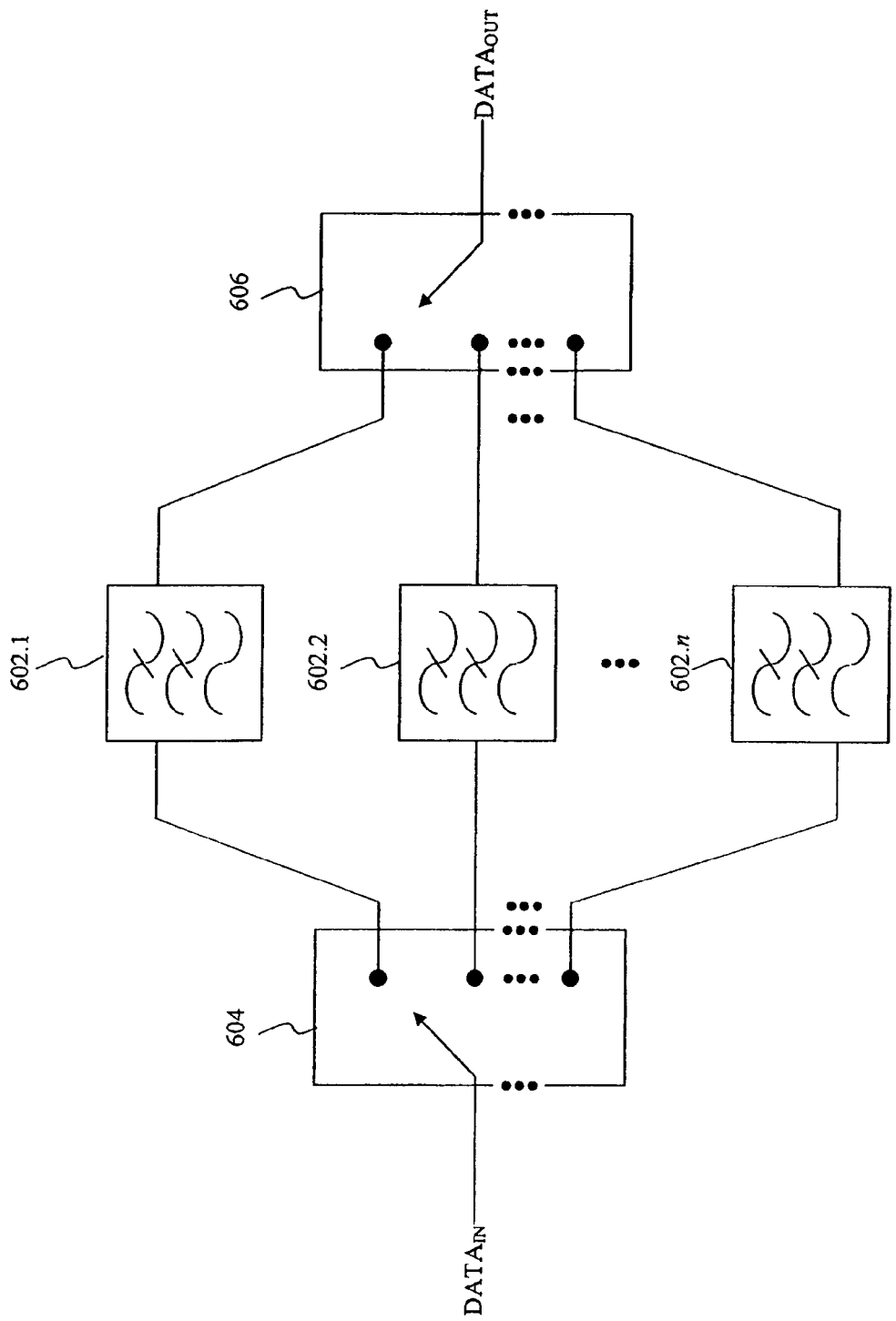
FIG. 6 illustrates a block diagram to segment a frequency range using multiple low pass filters according to an exemplary embodiment of the present invention.

FIG. 6 illustrates a block diagram to segment a frequency range using multiple low pass filters according to an exemplary embodiment of the present invention. A typical hard disk drive design contains a spindle on which the platters spin at a constant speed ranging from 5,000 to 15,000 revolutions per minute (RPM). As the magnetoresistive read sensor located on the read-write head reads the data from the platter, the frequency of the data is dependent upon the location of the data on the platter. For example, data located near the outer portion of the platter will have a frequency higher than data located near the center of the platter, i.e., the inner portion, because the data in the inner portion moves with a slower velocity than the data located near the outer portion of the platter. The frequency range of the data within a platter may be divided into multiple segments: 1 through n. Segmentation of the frequency range in multiple segments allows for optimization of the operational amplifiers for that frequency range. In addition, segmentation of the frequency range allows for greater resolution of the cut-off frequency, without losses in power and area.

Low pass filter 602.1 corresponds to a first frequency segment and may be implemented according to one the embodiments previously discussed. Low pass filter 602.2 corresponds to a second frequency segment and may be implemented according to one the embodiments previously discussed. Low pass filter 602.$n$ corresponds to the nth frequency segment and may be implemented according to one the embodiments previously discussed. In an exemplary embodiment, the frequency range is divided into three segments: a first frequency segment from 15 MHz to 50 MHz, a second frequency segment from 40 MHz to 120 MHz, and a third frequency segment from 100 MHz to 300 MHz.

Switch 604 and switch 606 operate in conjunction to select one of the low pass filters 602. Switch 604 is coupled to an input, denoted as $DATA_{IN}$, and includes a connection to each individual low pass filter 602. Switch 606 is coupled to an output, denoted as $DATA_{OUT}$, and includes a connection to each individual low pass filter 604. In another exemplary embodiment, $DATA_{IN}$ and $DATA_{OUT}$ are a differential signals.

When $DATA_{IN}$ contains a signal within a particular frequency segment, switch 604 and switch 606 select the low pass filter 602 that corresponds to that particular frequency segment and deactivates all remaining low pass filters corresponding to other frequency segments. The input $DATA_{IN}$ is routed to a corresponding low pass filter 602 via switch 604 whereby the input $DATA_{IN}$ is filtered by the corresponding low pass filter 602. The filtered input $DATA_{IN}$ is then routed to output $DATA_{OUT}$ via switch 610.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A low pass filter, comprising:
   a first stage including a first switchable resistor bank, the first gain stage having an input coupled to the first switchable resistor bank, and a first feedback capacitor, wherein the first feedback capacitor is coupled between the input of the first gain stage and an output of the first gain stage;
   a boost stage including a second switchable resistor bank coupled to the output of the first gain stage;
   a second stage coupled to the boost stage including a third switchable resistor bank, the second gain stage having an input coupled to the third switchable resistor bank, and a second feedback capacitor, wherein the second feedback capacitor is coupled between the second switchable resistor bank and an output of the second gain stage; and
   a third stage coupled to the boost stage including a fourth switchable resistor bank, the third gain stage having an input coupled to the fourth switchable resistor bank, and a third feedback capacitor, wherein the third feedback capacitor is coupled between the fourth switchable resistor bank and an output of the third gain stage and to the second switchable resistor bank.

2. The low pass filter of claim 1, further comprising:
   a fourth stage including a fifth switchable resistor bank, the fourth gain stage having an input coupled to the fifth switchable resistor bank and an output coupled to the first switchable resistor bank, and a fourth feedback capacitor, wherein the fourth feedback capacitor is coupled between the input of the fourth gain stage and the output of the fourth gain stage.

3. The low pass filter of claim 2, wherein the first, second, third, fourth, and fifth switchable resistor banks further comprise:
a plurality of resistors coupled to a common input and to a plurality of switches, wherein each switch is coupled to a corresponding resistor in the plurality of resistors.

4. The low pass filter of claim 2, wherein the first, the second, the third, and the fourth stages further comprise:
a switchable capacitor bank coupled between the input of the gain stage and the output of the gain stage.

5. The low pass filter of claim 4, wherein the switchable capacitor bank further comprises:
a plurality of capacitors coupled to a common input and to a plurality of switches, wherein each switch is coupled to a corresponding capacitor in the plurality of capacitors.

6. The low pass filter of claim 1, wherein the first and the second stages further comprise:
a first feedback resistor coupled between the input of first the gain stage and the output of the first gain stage; and
a second feedback resistor coupled between the input of the second gain stage and the output of the second gain stage.

7. The low pass filter of claim 6, wherein the feedback resistor further comprises:
a plurality of resistors coupled to a common input and to a plurality of switches, wherein each switch is coupled to a corresponding resistor in the plurality of resistors.

8. The low pass filter of claim 2, further comprising:
a first inversion resistor coupled between the output of the first gain stage and the input of the third gain stage; and
a second inversion resistor coupled between the output of the second gain stage and the input of the fourth gain stage.

9. The low pass filter of claim 8, wherein the first and the second inversion resistors further comprise:
a plurality of resistors coupled to a common input and to a plurality of switches, wherein each switch is coupled to a corresponding resistor in the plurality of resistors.

10. A low pass filter, comprising:
a first stage including a first switchable resistor bank, the first gain stage having an input coupled to the first switchable resistor bank and an output coupled to a second switchable resistor bank, and a first feedback capacitor coupled between the input of the first gain stage and the output of the first gain stage;
a second stage including the second switchable resistor bank, the second gain stage having an input coupled to the second switchable resistor bank and an output coupled to a third switchable resistor bank, and a second feedback capacitor coupled between the input of the second gain stage and the output of the second gain stage;
a boost stage including a fourth switchable resistor bank coupled to the output of the second gain stage;
a third stage including the third switchable resistor bank, the third gain stage having an input coupled to the third switchable resistor bank and an output coupled to a fifth switchable resistor bank, and a third feedback capacitor coupled between the input of the third gain stage and the output of the third gain stage; and
a fourth stage including the fifth switchable resistor bank the fourth gain stage having an input coupled to the fifth switchable resistor bank and to an output of the boost stage, and a fourth feedback capacitor coupled between the input of the fourth gain stage and an output of the fourth gain stage.

11. The low pass filter of claim 10, wherein the first, second, third, fourth, and fifth switchable resistor banks further comprise:
a plurality of resistors coupled to a common input and to a plurality of switches, wherein each switch is coupled to a corresponding resistor in the plurality of resistors.

12. The low pass filter of claim 10, wherein the first, the second, the third, and the fourth stages further comprise:
a switchable capacitor bank coupled between the input of the gain stage and the output of the gain stage.

13. The low pass filter of claim 12, wherein the switchable capacitor bank further comprises:
a plurality of capacitors coupled to a common input and to a plurality of switches, wherein each switch is coupled to a corresponding capacitor in the plurality of capacitors.

14. The low pass filter of claim 10, wherein the second and the fourth stages further comprise:
a first feedback resistor coupled between the input of the second gain stage and the output of the second gain stage; and a
a second feedback resistor coupled between the input of the fourth gain stage and the output of the fourth gain stage.

15. The low pass filter of claim 14, wherein the feedback resistor further comprises:
a plurality of resistors coupled to a common input and to a plurality of switches, wherein each switch is coupled to a corresponding resistor in the plurality of resistors.

16. The low pass filter of claim 10, further comprising:
a first inversion resistor coupled between the output of the second gain stage and the input of the first gain stage; and
a second inversion resistor coupled between the output of the fourth gain stage and the input of the third gain stage.

17. The low pass filter of claim 16, wherein the first and the second inversion resistors further comprise:
a plurality of resistors coupled to a common input and to a plurality of switches, wherein each switch is coupled to a corresponding resistor in the plurality of resistors.

* * * * *